US007259593B2

(12) United States Patent
Miyazawa

(10) Patent No.: US 7,259,593 B2
(45) Date of Patent: Aug. 21, 2007

(54) UNIT CIRCUIT, METHOD OF CONTROLLING UNIT CIRCUIT, ELECTRONIC DEVICE, AND ELECTRONIC APPARATUS

(75) Inventor: Takashi Miyazawa, Hokuto (JP)

(73) Assignee: Seiko Epson Corporation, Tokyo (JP)

( * ) Notice: Subject to any disclaimer, the term of this patent is extended or adjusted under 35 U.S.C. 154(b) by 91 days.

(21) Appl. No.: 11/290,581

(22) Filed: Dec. 1, 2005

(65) Prior Publication Data

US 2006/0138600 A1 Jun. 29, 2006

Related U.S. Application Data

(60) Provisional application No. 60/639,434, filed on Dec. 28, 2004.

(51) Int. Cl.
*H03K 19/0175* (2006.01)

(52) U.S. Cl. .............................. 326/83; 326/93; 345/99

(58) Field of Classification Search .................. 326/82, 326/83, 86, 93; 345/98–100, 204
See application file for complete search history.

(56) References Cited

U.S. PATENT DOCUMENTS 6,313,819 B1 * 11/2001 Maekawa et al. ............. 345/92
6,904,115 B2 * 6/2005 Lin ............................. 377/53
7,038,392 B2 * 5/2006 Libsch et al. ............ 315/169.3
7,161,571 B2 * 1/2007 Nally et al. ................... 345/92

OTHER PUBLICATIONS

You et al.; *Polarity-Balanced Driving to Reduce Vth Shift in a-Signal for Active-Matrix OLEDs*; SID Symposium Digest of Technical Papers, USA, Society for Information Display Information Display; vol. 35, No. 1, pp. 272-275, May 2004.

* cited by examiner

*Primary Examiner*—Don Le
(74) *Attorney, Agent, or Firm*—Oliff & Berridge, PLC

(57) ABSTRACT

A unit circuit includes: a capacitive element having a first electrode, a second electrode, and a dielectric layer interposed between the first and second electrodes; a transistor having a gate electrode connected to the first electrode; a first switching element that controls an electrical connection between the first electrode and a predetermined electric potential; and a second switching element connected to the second electrode. The electric potential of the first electrode is set to the predetermined electric potential by turning on the first switching element, and then, under a state in which the first electrode is electrically disconnected from the predetermined electric potential by turning off the first switching element, the electric potential of the first electrode is set to a first electric potential by a first operation signal supplied to the second electrode through the second switching element which is set to an ON state. After a first period during which the electric potential of the first electrode is set to the first electric potential is completed, a second period during which the electric potential of the first electrode is set to the predetermined electric potential by turning on the first switching element and a second operation signal is supplied to the second electrode through the second switching element which is set to the ON state is provided. After the second period is completed, under a state in which the first electrode is electrically disconnected from the predetermined electric potential by turning off the first switching element, the electric potential of the first electrode is set to a second electric potential by a third operation signal supplied to the second electrode through the second switching element which is set to the ON state. The first and second electric potentials have opposite polarities to each other when the predetermined electric potential is set to a reference potential.

19 Claims, 9 Drawing Sheets

RESET PERIOD (3)

UNIT CIRCUIT, METHOD OF CONTROLLING UNIT CIRCUIT, ELECTRONIC DEVICE, AND ELECTRONIC APPARATUS

BACKGROUND

1. Technical Field

The present invention relates to a unit circuit suitable for driving a driven element, such as an organic light-emitting element and a liquid crystal element, or an electronic element, to a method of controlling the unit circuit, to an electronic device such as an electro-optical device, and to an electronic apparatus.

2. Related Art

Transistors have been generally used to actively drive electro-optical elements, such as liquid crystal elements, organic electroluminescent elements (organic light emitting diode; hereinafter, referred to as 'OLED element'), or the like. However, the transistors need to be precisely controlled to realize high performance and multiple gray-scale levels.

Low-temperature polysilicon (LTPS) transistors have been used as such driving transistors in the related art; however, in recent years, amorphous silicon transistors have been drawing attention as the driving transistors in that a manufacturing cost can be reduced and uniform characteristics can be easily obtained. However, in the amorphous silicon transistors, when either positive voltages or negative voltages are continuously applied to the gate electrode, the threshold voltage thereof varies, which, for example, changes the brightness of the OLED elements, deteriorating the display quality.

This is because the characteristics of the transistors vary due to, for example, carriers stored as the carriers are continuously supplied to the transistors. Such a phenomenon is particularly noticeable in a case in which the amorphous silicon transistors are used as driving transistors. A technique for applying a negative voltage to a gate electrode of the driving transistors after applying a positive voltage thereto in order to stabilize the characteristics thereof is disclosed in Bong-Hyun You et al., "Polarity-Balanced Driving to Reduce Vth Shift in a Signal for Active-Matrix OLEDs", SID Symposium Digest of Technical Papers, USA, Society for Information Display, vol. 35, No. 1, pp. 272-275, May, 2004 (refer to FIGS. 3A and 3B).

However, in the technique, two driving transistors and two capacitive elements corresponding to the two driving transistors are needed, so that the circuit configuration becomes complicated. In particular, as the number of circuit elements, such as transistors or capacitive elements, increases, the circuit area becomes larger in proportion to the increased number, which reduces the aperture ratio.

Further, in the technique, since the negative voltage is supplied to the gate electrode of the driving transistor separately from the positive voltage, the circuit configuration is complicated. In addition, the dynamic range of the voltage becomes wide, so that the load on the circuit or the power consumption increases.

SUMMARY

An advantage of some aspects of the invention is that it provides a unit circuit capable of applying a voltage having a polarity different from that of a driving voltage to a driving transistor with a simple circuit configuration when a transistor is employed as the driving transistor for driving a driven element, a method of controlling the unit circuit, an electronic device, an electro-optical device, and an electronic apparatus.

According to an aspect of the invention, a unit circuit includes: a capacitive element having a first electrode, a second electrode, and a dielectric layer interposed between the first electrode and the second electrode; and a transistor having a gate electrode coupled to the first electrode, an electric potential of the first electrode being set to a first electrical potential by supplying a first operation signal to the second electrode.

The supplying of the first operation signal to the second electrode is carried out after the first electrode is set to a first predetermined electric potential, and the supplying of the first operational signal to the second electrode is carried out during at least a part of a period in which the first electrode is electrically disconnected from the first predetermined electric potential.

After a first step during which the electrical potential of the first electrode is set to the first electrical potential is completed, a second step during which the electrical potential of the first electrode is set to a second predetermined electric potential while a second operation signal is supplied to the second electrode is carried out.

The electrical potential of the first electrode is set to a second electrical potential by supplying a third operation signal to the second electrode after the first step is completed, the supplying of the third operation signal to the second electrode is carried out during at least a part of a period in which the first electrode is electrically disconnected from the second predetermined electric potential.

The unit circuit can supply voltages having a wide range of values to a gate of the transistor without expanding a range of operation signal levels.

In the unit circuit, preferably, a voltage level of the first predetermined electric potential may be equal to a voltage level of the second predetermined electric potential.

The unit circuit may further include: a first switching element that controls an electrical connection between the first electrode and at least one of the first predetermined electric potential and the second predetermined electrical potential; and a second switching element that is coupled to the second electrode.

In the unit circuit, the first electric potential and the second electric potential may have opposite polarities to each other when the first predetermined electric potential is used as a reference potential.

In the unit circuit, the first electric potential may be higher than the first predetermined electric potential, and the second electric potential may be lower than the first predetermined electric potential.

In the unit circuit, a signal level of the first operation signal may be equal to a signal level of the second operation signal.

According to an aspect of the invention, a unit circuit includes: a capacitive element having a first electrode, a second electrode, and a dielectric layer interposed between the first and second electrodes; a transistor having a gate electrode connected to the first electrode; a first switching element that controls an electrical connection between the first electrode and a predetermined electric potential; and a second switching element connected to the second electrode. The electric potential of the first electrode is set to the predetermined electric potential by turning on the first switching element, and then, under a state in which the first electrode is electrically disconnected from the predetermined electric potential by turning off the first switching element, the electric potential of the first electrode is set to a first electric potential by a first operation signal supplied to the second electrode through the second switching element which is set to an ON state. After a first period during which the electric potential of the first electrode is set to the first electric potential is completed, a second period during which the electric potential of the first electrode is set to the predetermined electric potential by turning on the first switching element and a second operation signal is supplied to the second electrode through the second switching element which is set to the ON state is provided.

After the second period is completed, under a state in which the first electrode is electrically disconnected from the predetermined electric potential by turning off the first switching element, the electric potential of the first electrode is set to a second electric potential by a third operation signal supplied to the second electrode through the second switching element which is set to the ON state. The first and second electric potentials have opposite polarities to each other when the predetermined electric potential is set to a reference potential.

According to the aspect of the invention, during the second period, since the first and second switching elements are turned on at the same time, the gate electrode of the transistor connected to the first electrode of the capacitive element is set to the predetermined electric potential and the second operation signal is supplied to the second electrode of the capacitive element, and thus the electric potential difference occurs between the both ends of the capacitive element. After the second period is completed, under a state in which the gate electrode of the transistor becomes in a floating state by turning off the first switching element, a third operation signal is supplied to the second electrode of the capacitive element through the second switching element. Then, the electric potential of the first electrode of the capacitive element varies while the electric potential difference is held. Here, the electric potential of the first electrode is set to the second electric potential whose polarity is opposite to that of the first electric potential, when the predetermined electric potential is set to a reference potential. As such, according to the aspect of the invention, the first and second electric potentials having opposite polarities to each other can be applied to the gate electrode of the transistor with a simple circuit configuration composed of two switching elements and one capacitive element. Thereby, it is possible to suppress the variation of the threshold voltage of the transistor which occurs due to, for example, carriers stored as the carries are continuously supplied to the transistor. In particular, the invention is very effective for a case in which an amorphous silicon transistor is adopted because the variation of the threshold voltage of the amorphous silicon transistor is large due to carriers supplied in one direction. In addition, the first and second periods are not necessarily continuous, but a predetermined interval may be provided therebetween.

In the unit circuit, preferably, the first electric potential is higher than the predetermined electric potential and the second electric potential is lower than the predetermined electric potential. In addition, in the unit circuit, even though the first and second operation signals may have different electric potentials, it is preferable that the first and second operation signals have the same electric potentials. In this case, it is possible to make the electric potential difference between the predetermined potential and the first electric potential equal to the electric potential difference between the predetermined potential and the second electric potential.

A method related to an aspect of the present invention is for controlling a unit circuit that includes a capacitive element having a first electrode, a second electrode, and a dielectric layer interposed between the first electrode and the second electrode, a transistor having a gate electrode coupled to the first electrode; a first switching element that controls an electrical connection between the first electrode and a predetermined electric potential; and a second switching element connected to the second electrode.

The method includes: setting an electric potential of the first electrode to the predetermined electric potential by turning on the first switching element; setting the electric potential of the first electrode to a first electric potential by supplying a first operation signal to the second electrode through the second switching element during at least part of a period in which the second transistor is in an ON-state, the supplying of the first operation signal to the second electrode being carried out during at least a part of a period in which the first electrode is electrically disconnected from the predetermined electric potential by turning off the first switching element; turning on the first switching element after a period during which the electric potential of the first electrode is set to the first electric potential is completed, and supplying a second operation signal to the second electrode through the second switching element during at least part of a period in which the second transistor is in an ON-state, the supplying of the second operation signal to the second electrode is carried out during at least a part of a period in which the electrical potential of the first electrode is set to the predetermined potential; and setting the electric potential of the first electrode to a second electric potential by supplying a third operation signal to the second electrode through the second switching element during at least part of a period in which the second transistor is in an ON-state, and the supplying of the third operation signal to the second electrode is carried out during at least a part of a period in which the first electrode is electrically disconnected from the predetermined electric potential by turning off the first switching element.

In the method, preferably, a polarity of a voltage level of the first electric potential may be opposite to a polarity of a voltage level of the second electric potential when the predetermined electric potential is used as a reference potential.

An electronic device related to an aspect of the present invention includes: a plurality of first signal lines; a plurality of second signal lines; a plurality of power supply lines; and a plurality of unit circuits.

Each of the plurality of unit circuits includes: a capacitive element having a first electrode, a second electrode, and a dielectric layer interposed between the first and second electrodes; a transistor having a gate electrode connected to the first electrode; a first switching element that controls an electrical connection between the first electrode and one of the plurality of power supply lines; and a second switching element connected to the second electrode.

An electric potential of the first electrode is set to a first electric potential by supplying a first operation signal to the second electrode through the second switching element during at least part of a period in which the second switching element is in an ON-state.

The supplying of the first operation signal to the second electrode is carried out after the first electrode is electrically connected to one power line of the power supply lines by turning on the first switching element, and the supplying of the first operation signal to the second electrode is carried out during at least a part of a period in which the first electrode is electrically disconnected from the one power supply line.

After a first step during which the electrical potential of the first electrode is set to the first electrical potential is completed, a second step during which the first electrode is electrically connected to the one power supply line by turning on the first switching element while a second operation signal is supplied to the second electrode through the second switching element during at least part of a period in which the second switching element is in an ON-state is carried out.

The electric potential of the first electrode is set to a second electric potential by supplying a third operation signal to the second electrode through the second switching element during at least part of a period in which the second switching element is in an ON-state.

The supplying of the third operation signal to the second electrode is carried out after the second period is completed, and the supplying of the third operation signal to the second electrode is carried out during at least a part of a period in which the first electrode is electrically disconnected from the one power supply line by turning off the first switching element.

In the electronic device, preferably, the one power supply line may be set to a predetermined potential, and the first and second electric potentials may have opposite polarities to each other when the predetermined electric potential is used as a reference potential.

In the electronic device, the plurality of first signal lines may be a plurality of scanning lines, the plurality of second signal lines being a plurality of data lines. The plurality of scanning lines may include a plurality of first control lines and a plurality of second control lines.

The first switching element may be controlled by a first control signal supplied through one first control signal line of the plurality of first control signal lines, and The second switching element may be controlled by a second control signal supplied through one second control signal line of the plurality of second control signal lines.

The electronic device may further includes: a driven element; a scanning line driving circuit that drive the plurality of scanning lines; and a data line driving circuit that drive the plurality of data line.

During an initialization period, the scanning line driving circuit may generate the first control signal and the second control signal so as to turn on the first switching element and the second switching element, respectively, and the data line driving circuit may set a potential of the second electrode to a reference potential, During an operation period subsequent to the initialization period, the scanning line driving circuit may generate the first control signal and the second control signal so as to turn off the first switching element and turn on the second switching element and the data line driving circuit may change the potential of the second electrode to an operation potential for driving the driven element from the reference potential, and then the scanning line driving circuit may generate the first control signal and the second control signal so as to turn off the first switching element and the second switching element, respectively.

During a reset period subsequent to the operation period, the scanning line driving circuit may generate the first control signal and the second control signal so as to turn on the first switching element and the second switching element, respectively, and the data line driving circuit may set the level of the data signal to the operation potential.

During a recovery period subsequent to the reset period, under a state in which the scanning line driving circuit may generate the first control signal and the second control signal so as to turn off the first switching element and turn on the second switching element, respectively, the data line driving circuit may set the level of the data signal to the reference potential, and then the scanning line driving circuit may generate the second control signal so as to turn off the second switching element.

In the electronic device, the one power supply line may be set to a predetermined potential, and the potential of the first electrode may be set to the predetermined potential during the reset period.

The driven element may be an electro-optical element.

Further, according to another aspect of the invention, a method of controlling a unit circuit that includes a capacitive element having a first electrode, a second electrode, and a dielectric layer interposed between the first and second electrodes; a transistor having a gate electrode connected to the first electrode; a first switching element that controls an electrical connection between the first electrode and a predetermined electric potential; and a second switching element connected to the second electrode, includes: setting the electric potential of the first electrode to the predetermined electric potential by turning on the first switching element; setting the electric potential of the first electrode to a first electric potential by using a first operation signal supplied to the second electrode through the second switching element which is set to an ON state, under a state in which the first electrode is electrically disconnected from the predetermined electric potential by turning off the first switching element; turning on the first switching element after a period during which the electric potential of the first electrode is set to the first electric potential is completed, and supplying a second operation signal to the second electrode through the second switching element which is set to the ON state under a state in which the electric potential of the first electrode is set to the predetermined potential; setting the electric potential of the first electrode to a second electric potential by supplying a third operation signal to the second electrode through the second switching element which is set to the ON state under a state in which the first electrode is electrically disconnected from the predetermined electric potential by turning off the first switching element; and setting the first and second electric potentials to have opposite polarities to each other when the predetermined electric potential is set to a reference potential. According to the aspect of the invention, in the unit circuit having a simple configuration composed of two switching elements and one capacitive element, it is possible to apply the first and second electric potentials having opposite polarities to each other to the gate electrode of the transistor. Thereby, it is possible to suppress the variation of the characteristics of the transistor. In particular, the invention is very effective for the case in which the amorphous silicon transistor is adopted because the variation of the threshold voltage of the amorphous silicon transistor is large due to carriers supplied in one direction.

Furthermore, according to still another aspect of the invention, an electronic device includes: a plurality of first signal lines; a plurality of second signal lines; a plurality of power supply lines; and a plurality of unit circuits. Each of the plurality of unit circuits includes: a capacitive element having a first electrode, a second electrode, and a dielectric layer interposed between the first and second electrodes; a transistor having a gate electrode connected to the first electrode; a first switching element that controls an electrical connection between the first electrode and one of the plurality of power supply lines; and a second switching element connected to the second electrode. The first electrode is electrically connected to one of the power supply lines by turning on the first switching element, and then, under a state in which the first electrode is electrically disconnected from the one of the power supply lines by turning off the first switching element, the electric potential of the first electrode is set to a first electric potential by a first operation signal supplied to the second electrode through the second switching element which is set to an ON state. After a first period during which the electric potential of the first electrode is set to the first electric potential is completed, a second period during which the first electrode is electrically connected to the one of the power supply lines by turning on the first switching element and a second operation signal is supplied to the second electrode through the second switching element which is set to the ON state is provided. After the second period is completed, under a state in which the first electrode is electrically disconnected from the one of the power supply lines by turning off the first switching element, the electric potential of the first electrode is set to a second electric potential by a third operation signal supplied to the second electrode through the second switching element which is set to the ON state.

According to the electronic device, it is possible to apply different electric potentials, such as the first and second electric potentials, to the gate electrode of the transistor. Here, preferably, the one of the power supply lines is set to a predetermined potential, and the first and second electric potentials have opposite polarities to each other when the predetermined electric potential is set to a reference potential. In this case, since the electric potentials having opposite polarities to each other can be applied to the gate electrode of the transistor, it is possible to suppress the variation of the characteristics of the transistor.

Furthermore, according to still another aspect of the invention, an electro-optical device includes: a plurality of scanning lines; a plurality of data lines; a plurality of pixel circuits provided at intersections between the plurality of scanning lines and the plurality of data lines, respectively; a scanning line driving circuit that drives the plurality of scanning lines; and a data line driving circuit that supplies each of the plurality of data lines with a data signal. The plurality of scanning lines includes a plurality of first control lines and a plurality of second control lines. Each of the plurality of pixel circuits includes: an electro-optical element; a transistor that drives the electro-optical element; a capacitive element one end of which is connected to a gate electrode of the transistor; a first switching element that is connected to the one end of the capacitive element and a transition between an ON state and an OFF state of which is controlled on the basis of a first control signal supplied through one of the plurality of first control lines and that serves to electrically connect the one end of the capacitive element to a predetermined potential during an ON state; and a second switching element that is provided between the other end of the capacitive element and one of the data lines and a transition between an ON state and an OFF state of which is controlled on the basis of a second control signal supplied through one of the plurality of second control lines and that supplies the other end of the capacitive element with the data signal during an ON state.

According to the aspect of the invention, in the unit circuit having a simple configuration composed of two switching elements and one capacitive element, it is possible to apply the electric potentials having opposite polarities to each other to the gate electrode of the transistor by suitably controlling the ON/OFF of the first and second switching elements. Thereby, it is possible to suppress the variation of the characteristics of the transistor. In particular, the invention is very effective for the case in which the amorphous silicon transistor is adopted because the variation of the threshold voltage of the amorphous silicon transistor is large due to carriers supplied in one direction.

Further, in the electro-optical device, preferably, under a state in which the electric potential of the gate electrode of the transistor is at an operation potential higher than the reference potential as much as a positive voltage corresponding to the brightness of the electro-optical element, the scanning line driving circuit generates the first and second control signals so as to turn on the first and second switching elements, respectively, and the data line driving circuit supplies the one of the data lines with the data signal whose electric potential becomes the operation potential, and then the scanning line driving circuit supplies the first and second control signals so as to make the second switching element hold an ON state under a state in which the first switching element is in an OFF state and the data line driving circuit supplies the one of the data lines with the data signal whose potential level drops from the operation potential.

According to the aspect of the invention, under a state in which the operation potential is applied to the gate electrode of the transistor, the first and second switching elements are turned on at the same time, so that the electric potential of the one end of the capacitive element becomes the predetermined potential and the electric potential of the other end thereof becomes the operation potential. As a result, the electric potential difference occurs between the both ends of the capacitive element. In addition, under a state in which the one end of the capacitive element is in a floating state by turning off the first switching element, the voltage applied to the other end of the capacitive element through the second switching element drops, which causes the voltage of the one end of the capacitive element to become a negative voltage. As a result, the negative voltage is applied to the gate electrode of the transistor. As such, according to the aspect of the invention, with a simple circuit configuration composed of two switching elements and one capacitive element, it is possible to apply both the positive and negative voltages to the gate electrode of the transistor, and thus it is possible to suppress the variation of the characteristics of the transistor. Here, the electro-optical element refers to an element whose optical characteristics can be controlled by an electrical operation and includes an organic light-emitting diode or an inorganic light-emitting diode, for example.

Furthermore, in the electro-optical device, preferably, during an initialization period, the scanning line driving circuit generates the first and second control signals so as to turn on the first and second switching elements, respectively, and the data line driving circuit sets the level of the data signal to a reference potential. During an operation period subsequent to the initialization period, the scanning line driving circuit generates the first and second control signals so as to turn off the first switching element and turn on the second switching element and the data line driving circuit sets the level of the data signal to an operation potential which is obtained by changing the level of the data signal from the reference potential as much as a positive voltage corresponding to the brightness of the electro-optical element, and then the scanning line driving circuit generates the first and second control signals so as to turn off the first and second switching elements, respectively. During a reset period subsequent to the operation period, the scanning line driving circuit generates the first and second control signals so as to turn on the first and second switching elements, respectively, and the data line driving circuit sets the level of the data signal to the operation potential. During a recovery period subsequent to the reset period, under a state in which the scanning line driving circuit generates the first and second control signals so as to turn off the first switching element and turn on the second switching element, respectively, the data line driving circuit sets the level of the data signal to the reference potential, and then the scanning line driving circuit generates the second control signal so as to turn off the second switching element.

According to the aspect of the invention, the electric potentials at the both ends of the capacitive element are initialized during the initialization period. Here, when the reference potential and the predetermined potential are set to be equal to each other, the voltage applied to the capacitive element becomes '0 volts', however, the invention is not limited thereto. Further, during the operation period, the one end of the capacitive element is in a floating state and the electric potential of the other end of the capacitive element rises as much as the positive voltage from the predetermined potential. Thereafter, since the operation potential is held in the gate capacitance of the transistor even though the second switching element is turned off, the transistor holds an ON state. Furthermore, during the reset period, the predetermined potential is applied to the gate electrode of the transistor, so that the transistor is turned off. Further, the electric potential difference occurs between the both ends of the capacitive element. Furthermore, during the recovery period, the gate electrode of the transistor is in a floating state and the electric potential of the other end of the capacitive element drops from the operation potential to the reference potential. Thereby, the electric potential of the one end of the capacitive element drops, so that it is possible to apply the negative voltage to the gate electrode of the transistor.

According to the aspect of the invention, it is possible to apply the negative voltage to the gate electrode of the amorphous silicon transistor which drives the electro-optical element, thereby suppressing the variation of the characteristics of the amorphous silicon transistor. In particular, since the variation of the characteristics (threshold voltage) of the amorphous silicon transistor can be suppressed, the brightness of the electro-optical element does not change and the high display quality can be maintained. Further, since the circuit configuration for applying the negative voltage to the transistor is simple, it is possible to suppress the aperture ratio from being reduced.

In addition, since it is possible to apply the negative voltage to the gate electrode of the transistor only by supplying the positive voltage from the second switching element, it is not necessary to supply the pixel circuit with the negative voltage from the outside and to widen the dynamic range of the voltage level. Therefore, the circuit design becomes easy and the power consumption does not increase.

Further, according to still another aspect of the invention, an electronic apparatus includes the electro-optical device described above. For example, the electronic apparatus includes a large display in which a plurality of panels are connected to one another, a personal computer, a mobile phone, a personal digital assistant, and the like.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
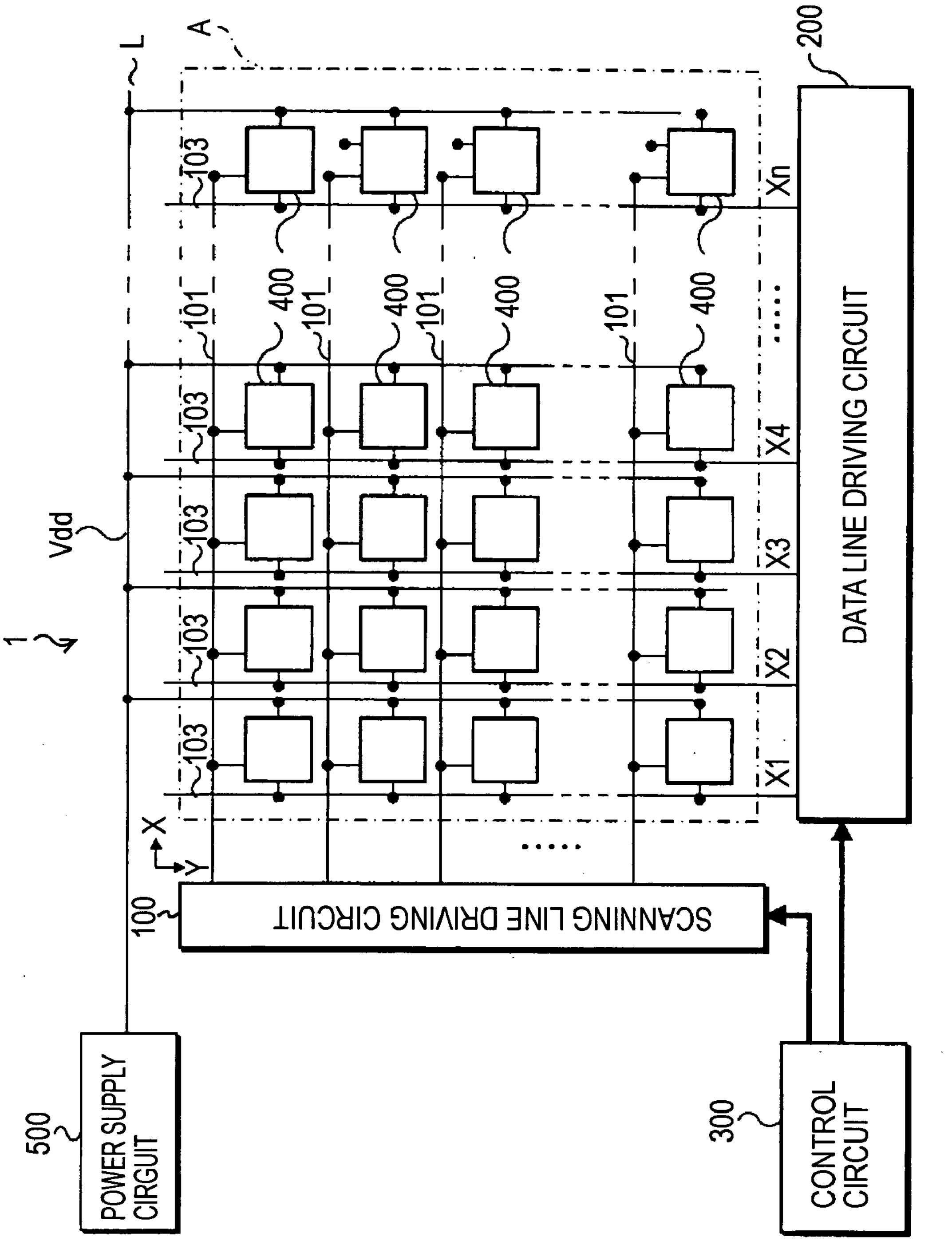
FIG. 1 is a block diagram illustrating the configuration of an electro-optical device according to a first embodiment of the invention.
Figure 2:
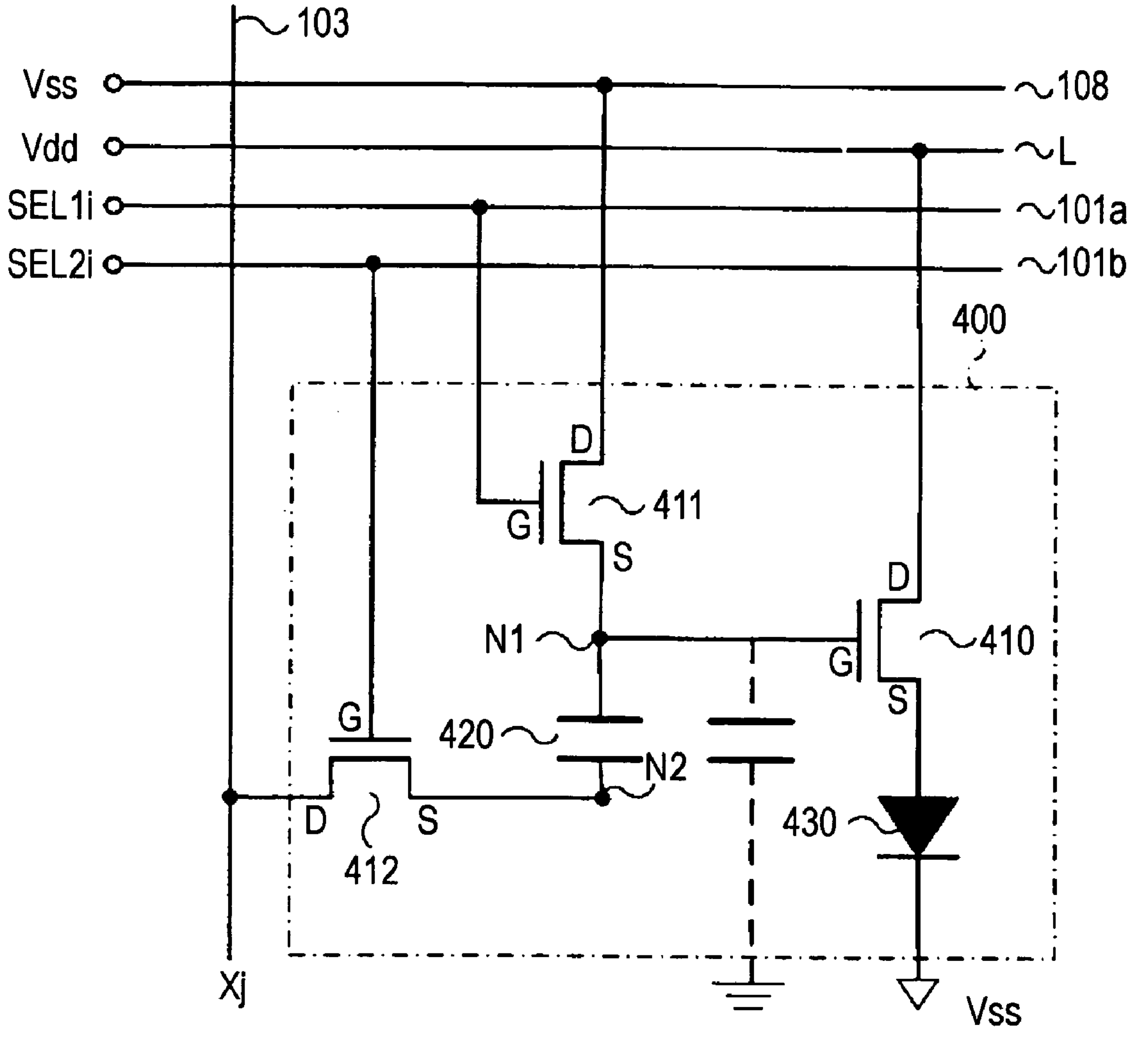
FIG. 2 is a view illustrating a pixel circuit of the electro-optical device.

FIG. 1 is a block diagram schematically illustrating the configuration of an electro-optical device according to an aspect of the invention, and FIG. 2 is a circuit diagram illustrating a pixel circuit. As shown in FIG. 1, the electro-optical device 1 includes a display panel A, a scanning line driving circuit 100, a data line driving circuit 200, a control circuit 300, and a power supply circuit 500. In the display panel A, 'm' (for example, m=360) scanning lines 101 are formed to be parallel to the X direction, and 'n' (for example, n=480) data lines 103 are formed to be parallel to the Y direction perpendicular to the X direction. In addition, a pixel circuit 400 is provided at an intersection between each of the scanning lines 101 and each of the data lines 103. The pixel circuit 400 includes an OLED element 430. A power supply voltage Vdd is supplied to each pixel circuit 400 through a power supply line L, and all the pixel circuits 400 are commonly connected to a low electric potential (reference) voltage Vss of the power supply circuit 500 through a power supply line 108 (see FIG. 2). In the present embodiment, the low electric potential voltage Vss is '0 volts'.

In addition, in the present embodiment, even though only the scanning lines 101 are provided to extend in the X direction in FIG. 1, a first control line 101*a* and a second control line 101*b* are used as each of the scanning lines 101, as shown in FIG. 2. As such, the control lines 101*a* and 101*b* form a pair to be used for a row of pixel circuits 400.

The scanning line driving circuit 100 supplies a first control signal SEL1 to the first control line 101*a* and supplies a second control signal SEL2 to the second control line 101*b*. Specifically, the scanning line driving circuit 100 selects a row of scanning lines 101 during each one horizontal scanning period, and supplies the first and second control signals SEL1 and SEL2 to the first and second control lines 101*a* and 101*b*, respectively, in correspondence with the selection. A first control signal SEL1 supplied to a first control line 101*a* at an i-th row is denoted by SEL1i , and a second control signal SEL2 supplied to a second control line 101*b* at an i-th row is denoted by SEL2i.

The data line driving circuit 200 supplies, through a data line 103, a data signal having a voltage corresponding to a current (that is, gray-scale level of a pixel) which is to flow through an OLED element 430 of each of the pixel circuits 400, to each of a row of pixel circuits 400 corresponding to scanning lines 101 selected by the scanning line driving circuit 100. Here, the data signal (data voltage) is set to make a pixel brighter as the voltage is higher, while it is set to make the pixel darker as the voltage is lower. For the convenience of explanation, a data signal supplied to a data line 103 at a j-th column is denoted by Xj.

The control circuit 300 supplies clock signals (not shown) to the scanning line driving circuit 100 and the data line driving circuit 200 so as to control the scanning line driving circuit 100 and the data line driving circuit 200, and supplies to the data line driving circuit 200 image data that specifies the gray-scale level for each pixel.

Next, the pixel circuit 400 will be described with reference to FIG. 2. In FIG. 2, the pixel circuit 400 corresponds to one located at the i-th row. As shown in FIG. 2, the pixel circuit 400 includes a driving transistor 410, n-channel transistors 411 and 412 serving as first and second switching unit, a capacitive element 420, and an OLED element 430 serving as an electro-optical element. Here, the driving transistor 410 is an n-channel amorphous silicon transistor. In addition, since the transistors 411 and 412 are formed in the same process as the driving transistor 410, they are also amorphous silicon transistors. The OLED element 430 is a light-emitting element that emits light having a brightness corresponding to a forward current, and an organic EL (electroluminescent) material corresponding to a color of emitted light is used for a light-emitting layer thereof. In a process of manufacturing the light-emitting layer, the organic EL material is discharged from an inkjet type head as a liquid droplet to be dried.

A drain electrode of the driving transistor 410 is connected to the power supply line L so as to be supplied with the power supply voltage Vdd, and a source electrode of the driving transistor 140 is connected to an anode of the OLED element 430. A cathode of the OLED element 430 is connected to the low electric potential voltage Vss of a power supply. As such, it is configured that the OLED element 430 and the driving transistor 410 are electrically interposed between the power supply voltage Vdd and the low electric potential voltage Vss. In addition, the cathode of the OLED element 430 serves as a common electrode over the entire pixel circuit 400.

A gate electrode of the driving transistor 410 is connected to one end of the capacitive element 420 and a source electrode of the transistor 411. For the convenience of explanation, the one end (the gate electrode of the driving transistor 410) of the capacitive element 420 is set to a node N1. At the node N1, there exists a parasitic capacitance as shown by a dotted line in FIG. 2. The parasitic capacitance is a capacitance that is parasitic between the node N1 and the cathode of the OLED element 430 and includes the gate capacitance of the driving transistor 410, the capacitance of the OLED element 430, and the capacitance due to a parasitic capacitance of a wiring line between the node N1 and the cathode of the OLED element 430.

A drain electrode of the transistor 411 is connected to the power supply line 108 so as to be supplied with the low electric potential voltage Vss (predetermined electric potential), and a gate electrode of the transistor 411 is connected to the first control line 101*a*. That is, the gate electrode of the transistor 411 is supplied with the first control signal SEL1i through the first control line 101*a*. When the first control signal SEL1i changes to an H level, the transistor 411 is turned on, and thus the node N1 is electrically connected to the power supply line 108. Accordingly, the voltage at the node N1 becomes the low electric potential voltage Vss (=0 volts).

The transistor 412 is interposed between the other end of the capacitive element 420 and the data line 103. A source electrode of the transistor 412 is connected to the other end of the capacitive element 420 and a drain electrode of the transistor 412 is connected to the data line 103. In addition, a gate electrode of the transistor 412 is connected to the second control line 101*b*. That is, the gate electrode of the transistor 412 is supplied with the second control signal SEL2i through the second control line 101*b*. Therefore, when the second control signal SEL2i changes to an H level, the transistor 412 is turned on, and thus a data signal (the voltage of the data signal) supplied to the data line 103 is applied to the other end of the capacitive element 420. In addition, for the convenience of explanation, the other end (the source of the transistor 412) of the capacitive element 420 is set to a node N2.

Figure 3:
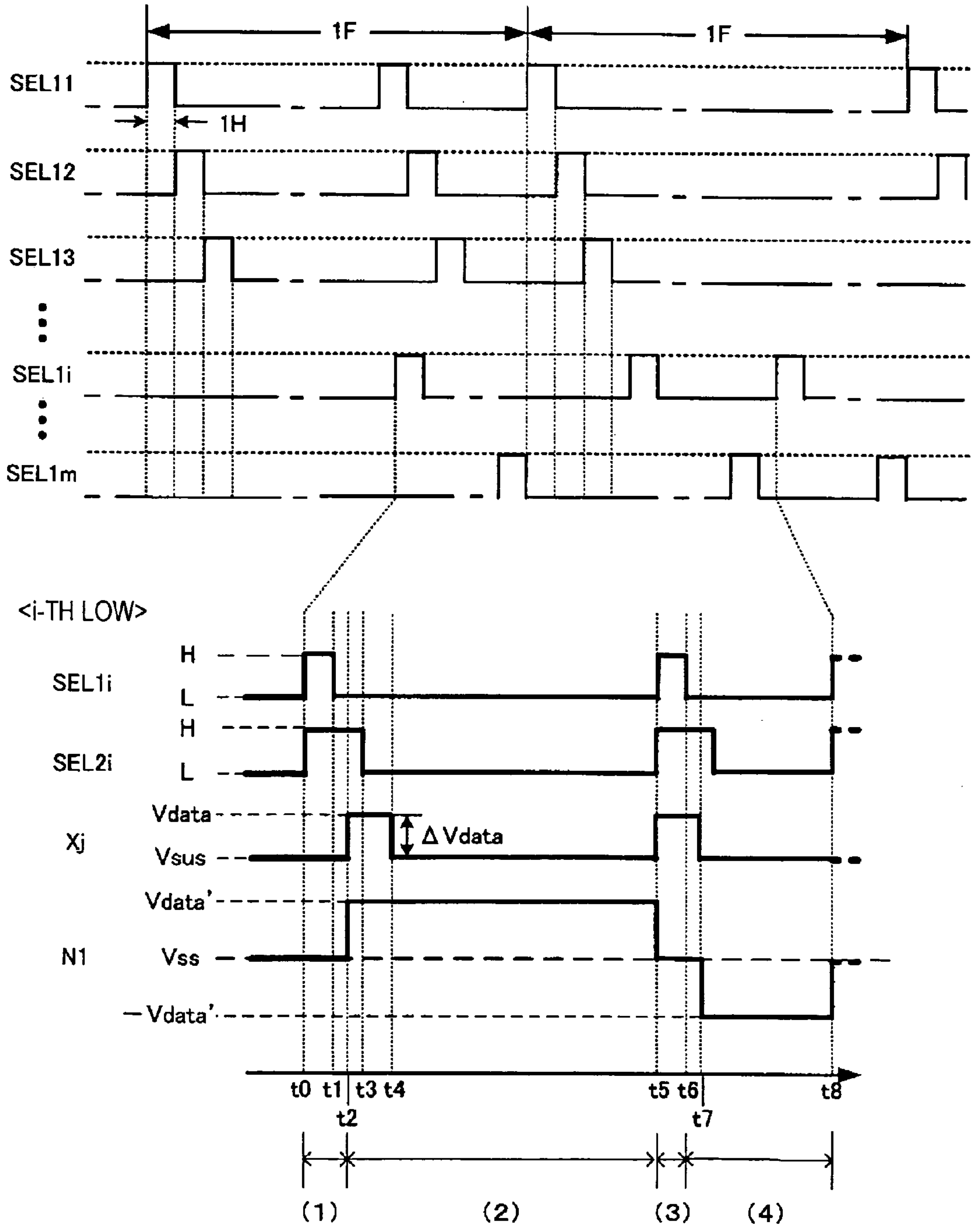
FIG. 3 is a timing chart illustrating an operation of the electro-optical device.

Next, an operation of the electro-optical device 1 will be described. FIG. 3 is a timing chart for explaining the operation of the electro-optical device 1.

First, as shown in FIG. 3, the scanning line driving circuit 100 sequentially selects the scanning lines 101 at the first, second, third, . . . , and m-th rows one by one for each one horizontal scanning period (1H) from the start of one vertical scanning period (1F), and changes only the level of a scanning signal supplied to the selected scanning line 101 to an H level and changes the levels of scanning signals supplied to other scanning lines to L levels.

Here, an operation when the scanning line 101 at an i-th row is selected and a scanning signal Yi changes to an H level will be described with reference to FIGS. 3 to 7.

As shown in FIG. 3, an operation of the pixel circuit 400 located at an i-th row and j-th column is largely divided into four periods: an initialization period (1), an operation period (2), a reset period (3), and a recovery period (4).

Hereinafter, the operation during the periods will be described in sequence.

Figure 4:
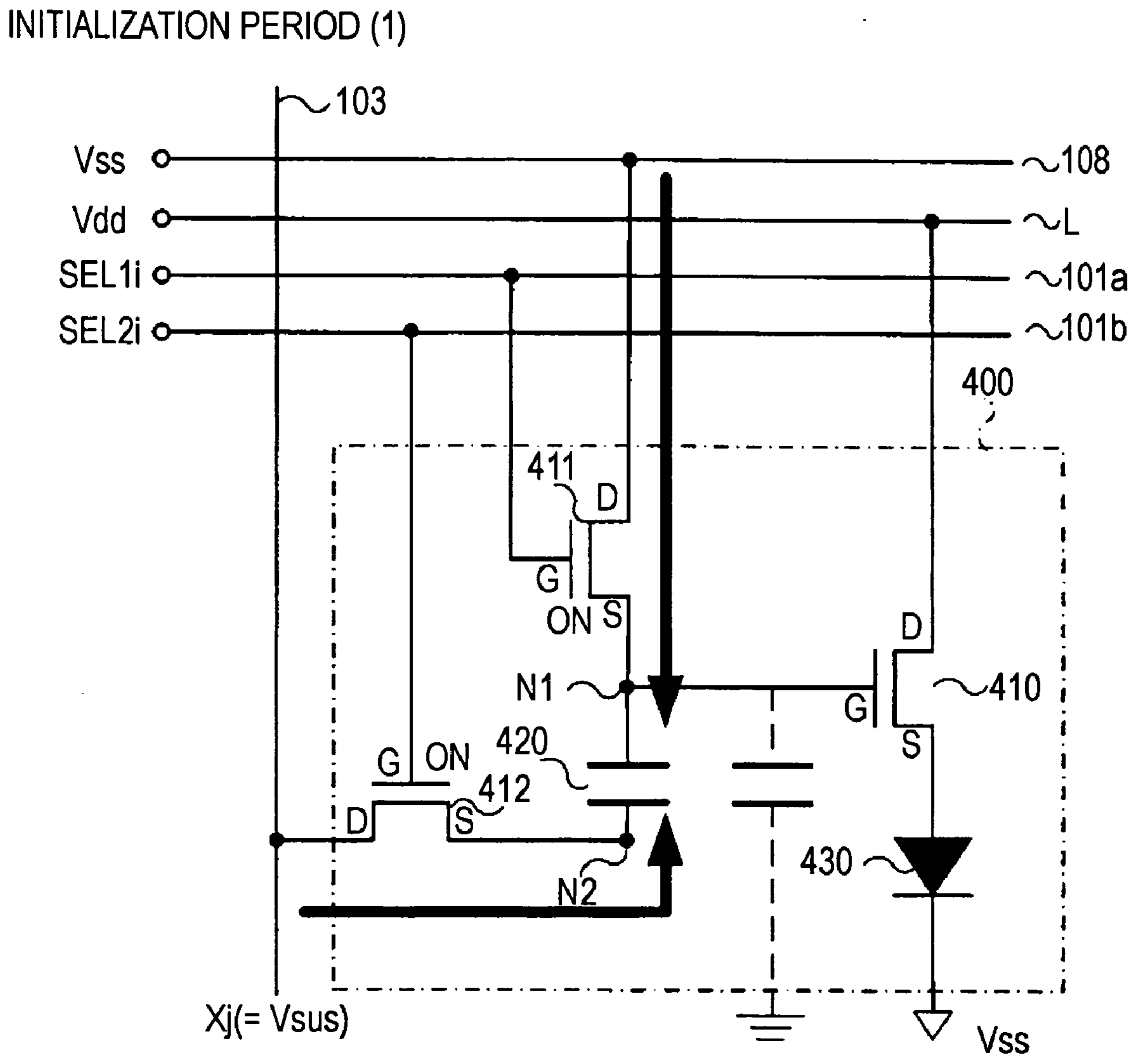
FIG. 4 is an explanatory view illustrating the operation of the pixel circuit.

The initialization period (1) starts at a timing t0 when the first control signal SEL1i changes to an H level, and prepares a writing operation of the pixel circuit 400 in this period. Specifically, both the first and second control signals SEL1i and SEL2i are L levels before the timing t0. At the timing t0, the first and second control signals SEL1i and SEL2i are changed to H levels by the scanning line driving circuit 100. Accordingly, as shown in FIG. 4, in the pixel circuit 400, the transistor 411 is turned on by the first control signal SEL1i having the H level. As a result, in the pixel circuit 400 during the initialization period (1), the node N1, which is one end of the capacitive element 420, is electrically connected to the power supply line 108 through the transistor 411, and the voltage at the node N1 becomes a low electric potential voltage Vss (0 volts). Further, at the timing t0, the transistor 412 is also turned on by the second control signal SEL2i having the H level, and thus the node N2, which is the other end of the capacitive element 420, is electrically connected to the data line 103 through the transistor 412 and the voltage at the node N2 becomes a reference potential Vsus (which will be described later) of the data line 103.

Figure 5:
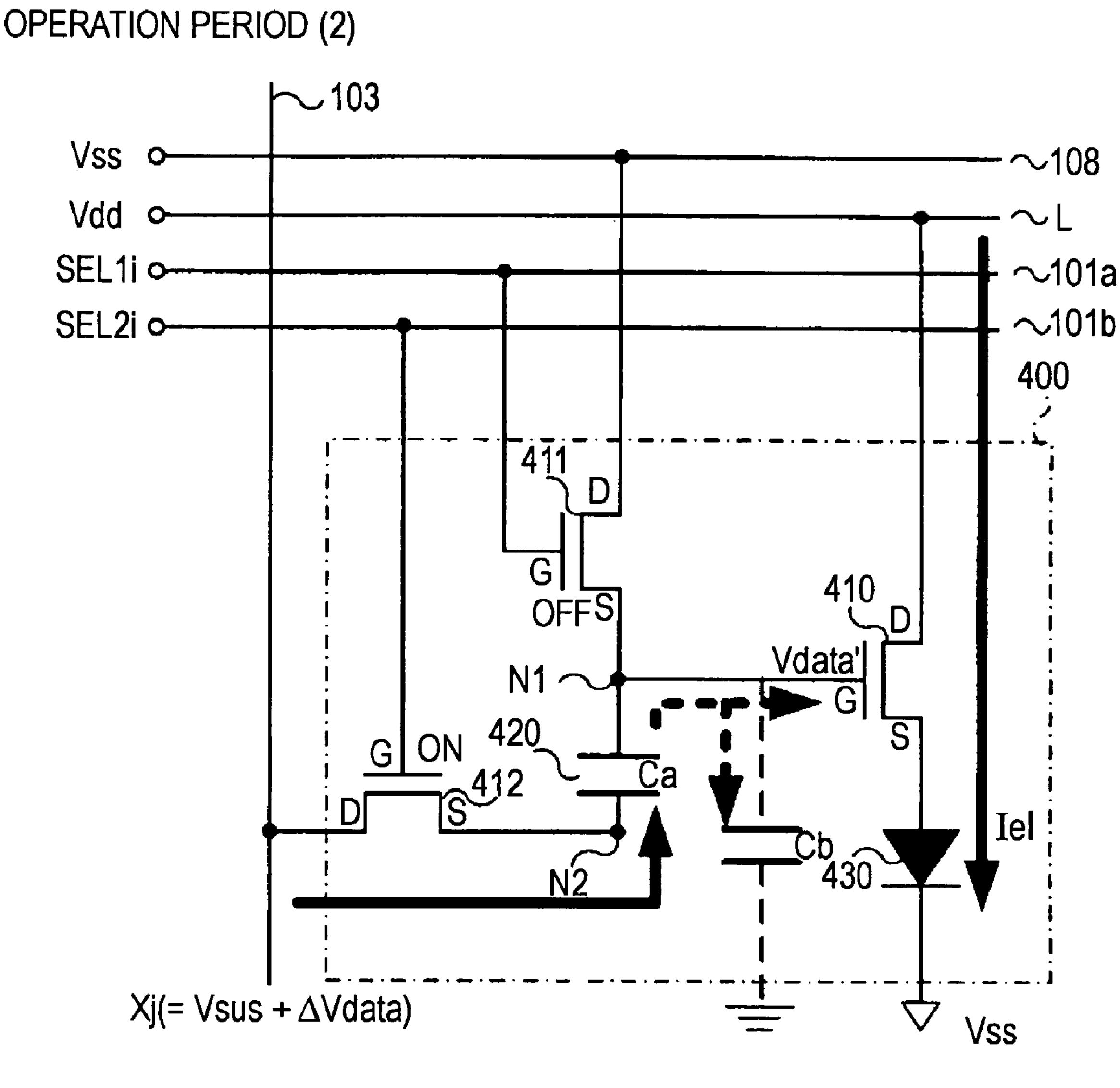
FIG. 5 is an explanatory view illustrating the operation of the pixel circuit.

During the operation period (2), a data signal Xj, which has a data voltage corresponding to the gray scale level of a pixel located at the i-th row and j-th column, is supplied to the pixel circuit 400 through the data line 103, and thus the OLED element 430 emits light having brightness corresponding to the data voltage. Specifically, at a timing t1, the scanning line driving circuit 100 makes the second control signal SEL2i return to an L level and the first control signal SEL1i hold the H level. Accordingly, as shown in FIG. 5, the transistor 411 is turned off, and thus a path from the node N1 to the power supply line 108 is electrically disconnected. As a result, the node N1 is in a floating state.

Then, at a timing t2, the data line driving circuit 200 supplies a j-th data line 103 with the data signal Xj corresponding to the gray scale level of the pixel located at the i-th row and j-th column. Specifically, the data signal Xj specifies the gray-scale level of a pixel by changing (increasing) the reference potential Vsus as much as ΔVdata. That is, Vsus+ΔVdata becomes an operation potential. Accordingly, when the pixel is specified to have a black color which is the lowest gray-scale level, ΔVdata is 0 volts, and as a brighter gray scale is specified, ΔVdata increases gradually.

In this case, the voltage at the node N2, which is the other end of the capacitive element 420, rises as much as ΔVdata according to the voltage variation of the data signal Xj. At a timing t3, the scanning line driving circuit 100 makes the second control signal SEL2i return to an L level and the transistor 412 is turned off. Then, at a timing t4, the level of the data signal Xj returns to the reference potential Vsus.

Here, at the timing t3, both the transistors 411 and 412 are turned off, so that the voltage at the node N1 is held by only the gate capacitance of the driving transistor 410. For this reason, the voltage at the node N1 rises from the voltage during the initialization period (1), as much as an amount obtained by dividing the voltage variation amount ΔVdata at the node N2 by the capacitance ratio between the capacitance of the capacitive element 420 and the gate capacitance of the driving transistor 410.

More specifically, when the capacitance of the capacitive element 420 is Ca and the gate capacitance of the driving transistor 410 is Cb, the voltage at the node N1 rises as much as $\{\Delta Vdata \cdot Ca/(Ca+Cb)\}$ from the low electric potential voltage Vss (=0 volts) by capacitance coupling of the capacitive element 420. In general, the gate capacitance Cb of the driving transistor 410 is so small as to be negligible as compared with the capacitance Ca of the capacitive element 420. Therefore, $\Delta Vdata \cdot Ca/(Ca+Cb)$ can be considered to be almost equal to ΔVdata, and accordingly, the voltage at the node N1 rises as much as ΔVdata from the low electric potential voltage Vss so as to be Vdata' ($\cong$Vss+ΔVdata=ΔVdata).

Further, since the driving transistor 410 is turned on by the voltage Vdata' at the node N1, an anode of the OLED element 430 is electrically connected to the power supply line L, and thus a current Iel corresponding to the voltage at the node N1 flows through the OLED element 430. Thereby, the OLED element 430 keeps emitting light having brightness corresponding to the current Iel.

Here, even though the current Iel flowing through the OLED element 430 is determined by a voltage between the gate and the source of the driving transistor 410, the voltage is the voltage at the node N1, that is, Vdata'. Thereby, the OLED element 430 emits light having brightness defined by the voltage of the data signal Xj. In addition, when the gate capacitance Cb of the driving transistor 410 is not negligible as compared with the capacitance Ca of the capacitive element 420, the voltage at the node N1, that is, Vdata', becomes Vss+$\{\Delta Vdata \cdot Ca/(Ca+Cb)\}$, and the voltage at the node N1 drops by a voltage corresponding to the gate capacitance Cb. Therefore, in this case, it is necessary to provide the data signal Xj having a voltage obtained by correcting the voltage corresponding to the gate capacitance Cb in advance.

Figure 6:
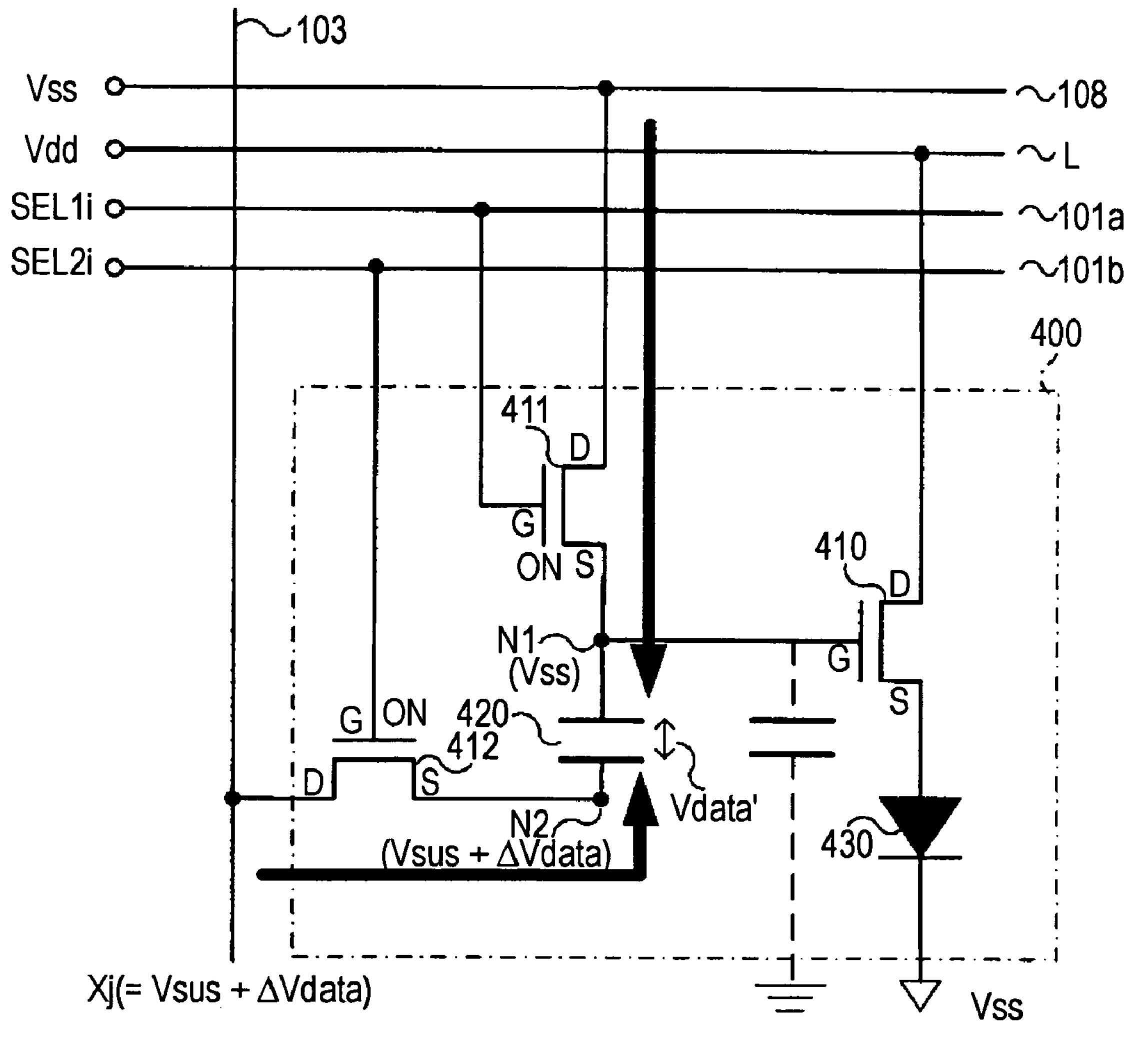
FIG. 6 is an explanatory view illustrating the operation of the pixel circuit.

However, during the reset period (3) subsequent to the operation period (2), the voltage at the node N1 is reset to the low electric potential voltage Vss, and accordingly, the OLED element 430 does not emit light. Specifically, at a timing t5, the first and second control signals SEL1i and SEL2i are changed to H levels by the scanning line driving circuit 100. Thereby, as shown in FIG. 6, the transistor 411 is turned on, and thus the node N1, which is one end of the capacitive element 420, is electrically connected to the power supply line 108 so as to make the voltage at the node N1 reset to the low electric potential voltage Vss (=0 volts). As a result, the driving transistor 410 is turned off to make the anode of the OLED element 430 electrically disconnected from the power supply line L, and thus the OLED element 430 does not emit light.

Furthermore, the transistor 412 is turned on by the second control signal SEL2i having the H level, and thus the node N2, which is the other end of the capacitive element 420, is electrically connected to the data line 103.

Here, at the start timing t5 of the reset period (3), the data line driving circuit 200 supplies the j-th data line 103 with the data signal Xj having a voltage obtained by increasing the reference potential Vsus as much as ΔVdata. As such, at the timing t5, since the node N2 is electrically connected to the data line 103 and the node N1 is electrically connected to the power supply line 108 so as to hold the low electric potential voltage Vss (=0 volts), the voltage at the node N2 rises by ΔVdata according to the voltage variation of the data signal Xj. As a result, the electric potential difference Vdata' occurs between the nodes N1 and N2.

Figure 7:
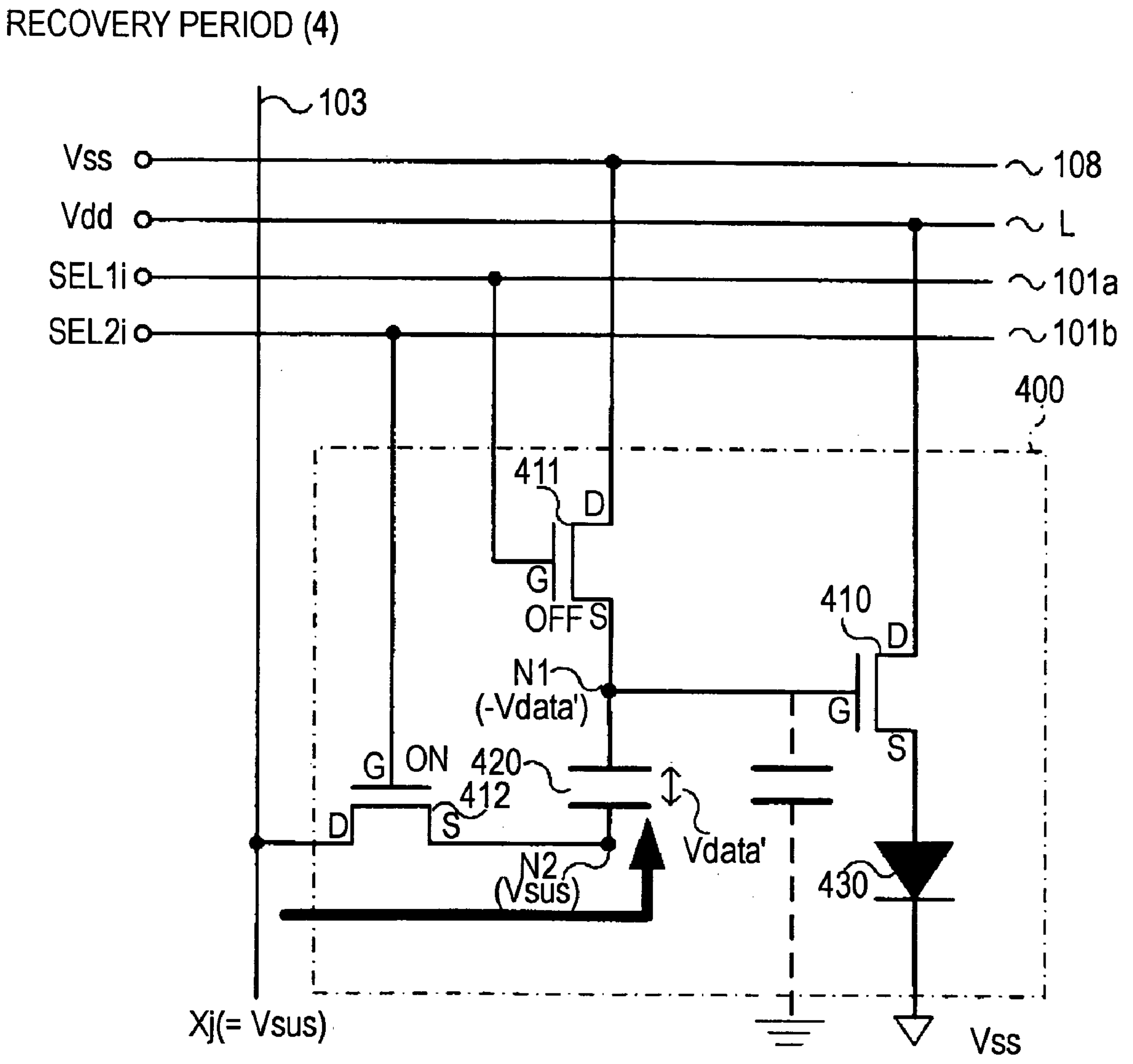
FIG. 7 is an explanatory view illustrating the operation of the pixel circuit.

During the recovery period (4) subsequent to the reset period (3), the voltage at the node N1 becomes a negative voltage, and thus a reverse bias (negative voltage) is applied to the gate electrode of the driving transistor 410. More specifically, at a timing t6, the scanning line driving circuit 100 makes the first control signal SEL1i return to the L level and the second control signal SEL2i hold the H level. Thereby, as shown in FIG. 7, the transistor 411 is turned off, and thus the node N1 is electrically disconnected from the power supply line 108 to be in a floating state, while the transistor 412 is turned on to thus make the node N2 electrically connected to the data line 103. Under this state, since the data signal Xj having a data voltage of Vsus+ΔVdata is continuously supplied to the node N2 through the data line 103, the electric potential difference between the nodes N1 and N2 is held as Vdata'.

Then, at a timing t7, the data line driving circuit 200 drops the data voltage of the data signal Xj as much as ΔVdata to return to the reference potential Vsus. As a result, the voltage at the node N2, which is the other end of the capacitive element 420, drops by ΔVdata. At this time, since the electric potential difference of Vdata' is held between the nodes N1 and N2 and the node N1 is in a floating state, as the voltage at the node N2 drops, the voltage at the node N1 drops as much as the voltage drop at the node N2 to become −Vdata'. Thereby, a negative voltage is applied to the gate electrode of the driving transistor 410. The recovery period (4) is held until a timing t8 at which the scanning line 101 at the i-th row is selected to thus make the first control signal SEL1i are changed to the H level during the next vertical scanning period (1F), and the negative voltage is continuously applied to the driving transistor 410 during the recovery period (4). Then, at the timing t8, the initialization period (1), the operation period (2), the reset period (3), and the recovery period (4) are repeated in the pixel circuit 400.

In addition, the lengths of the initialization period (1), the operation period (2), the reset period (3), and the recovery period (4) can be suitably set. In particular, it is possible to make the entire screen brighter by setting the operation period (2) longer or to make it darker by setting the operation period (2) shorter.

Further, even though the pixel circuit 400 at the i-th row has been described in the invention, the operation described above can be applied to the pixel circuits 400 at the other rows in the same manner. That is, during a period from a time when the scanning line 101 is selected to thus make the scanning signal are changed to the H level to a time when the scanning line 101 is selected to thus make the scanning signal are changed to the H level during the next vertical scanning period (1F), the series of operations during the initialization period (1), the operation period (2), the reset period (3), and the recovery period (4) are performed.

A Low-temperature polysilicon (LTPS) transistor has been used as the driving transistor 410 for driving the OLED element 430 in the related art; however, in recent years, an amorphous silicon transistor has been drawing attention in that a manufacturing cost can be reduced and uniform characteristics can be easily obtained. However, in the amorphous silicon transistor, when either positive voltages or negative voltages are continuously applied to the gate electrode, the threshold voltage thereof varies, which, for example, changes the brightness of the OLED element 430, deteriorating the display quality. In contrast, according to the embodiment described above, the positive voltage is applied to the gate electrode of the driving transistor 410 during the operation period and the negative voltage is applied to the gate electrode of the driving transistor 410 during the recovery period, so that it is possible to considerably reduce the variation of the threshold voltage of the driving transistor 410 and to prevent a difference in the brightness of the OLED elements 430 even though the amorphous silicon transistor is employed as the driving transistor 410, thereby realizing a high-quality display. In addition, even in other types of transistors, such as the Low-temperature polysilicon transistor, as carriers are continuously supplied to the transistor, the characteristics of the transistor vary due to the stored carriers or the like, and this is the same as in the amorphous silicon transistor. Therefore, even when the Low-temperature polysilicon transistor or the like is employed as the driving transistor 410, the above-described embodiment is effective.

Further, according to the present embodiment, it is possible to suppress the variation of the characteristics of the driving transistor 410 by applying the negative voltage to the gate electrode (node N1) of the driving transistor 410 with the simple circuit configuration in which the two transistors 411 and 412 and the one capacitive element 420 are combined to each other. Furthermore, since it is possible to reduce the number of elements, such as a transistor or a capacitor, included in the pixel circuit 400 as compared with the related art and to reduce the area occupied by those elements in the pixel circuit 400, it is possible to maintain the excellent aperture ratio.

Further, during the reset period (3), since the data line driving circuit 200 supplies the data line 103 with the data signal Xj having a positive voltage so that a negative voltage can be applied to the gate electrode of the driving transistor 410, it is not necessary to supply the negative voltage to the driving transistor 410 from the outside and to widen the dynamic range of the voltage level in the electro-optical device 1. Thereby, the circuit design becomes easy and the power consumption does not increase.

Furthermore, during the reset period (3), the data line driving circuit 200 supplies a signal having the same voltage as the data signal Xj supplied to the data line 103 during the operation period (2), so that, during the recovery period (4), a negative voltage having the same magnitude as the voltage (Vdata') applied during the operation period (2) is continuously applied to the gate electrode (node N1) of the driving transistor 410. As a result, it is possible to suppress the variation of the characteristics of the driving transistor 410 further effectively.

Further, the OLED element 430 uses organic light-emitting materials using monomer, polymer, dendrimer, or the like. The OLED element 430 is an example of a current-driving element. Instead of the OLED element 430, it is possible to use other self-luminous elements, such as an inorganic EL element, a field emission (FE) element, a surface-conduction-type emission (SE) element, a ballistic electron emission (BS) element, an LED, and the like, an electrophoresis element, an electrochromic element, and so on. In addition, the invention can also be applied to an electro-optical device, such as a writing head used for an optical printer or an electronic copying machine, in the same manner as in the embodiment described above.

Furthermore, the invention can be applied to any device including a unit circuit in which an amorphous transistor is used as a driving transistor for driving a driven transistor. For example, the invention can be applied to a sensor such as a biochip. Here, the unit circuit corresponds to the pixel circuit 400, and various driven elements are provided instead of the OLED element 430.

Figure 8:
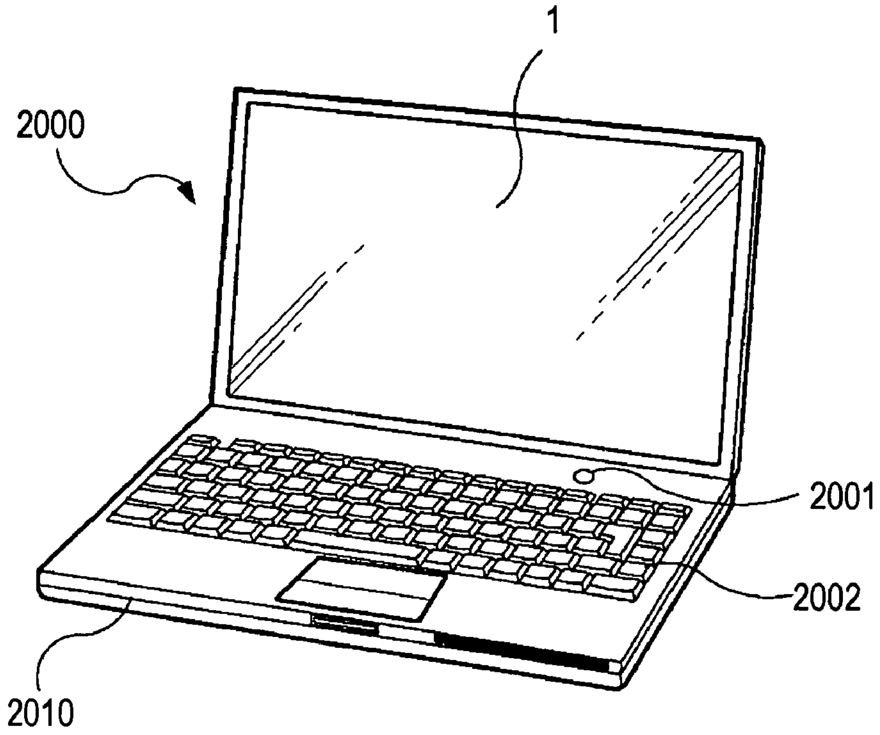
FIG. 8 is a view illustrating a personal computer to which the electro-optical device is applied.

Next, an electronic apparatus to which the above-described electro-optical device 1 is applied will be described. FIG. 8 illustrates the configuration of a portable personal computer to which the electro-optical device 1 is applied. The personal computer 2000 includes the electro-optical device 1 serving as a display unit and a main body 2010. The main body 2010 is provided with a power switch 2001 and a keyboard 2002. Since the electro-optical device 1 uses the OLED element 430, it is possible to display a screen having a wide viewing angle.

Figure 9:
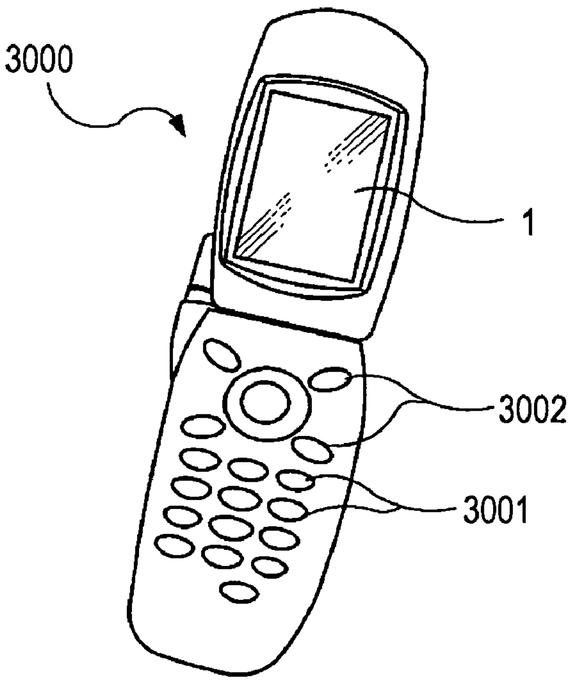
FIG. 9 is a view illustrating a mobile phone to which the electro-optical device is applied.

FIG. 9 illustrates the configuration of a mobile phone to which the electro-optical device 1 is applied. The mobile phone 3000 includes a plurality of operation buttons 3001 and scroll buttons 3002, and the electro-optical device 1 serving as a display unit. By operating the scroll buttons 3002, a screen displayed on the electro-optical device 1 is scrolled.

Figure 10:
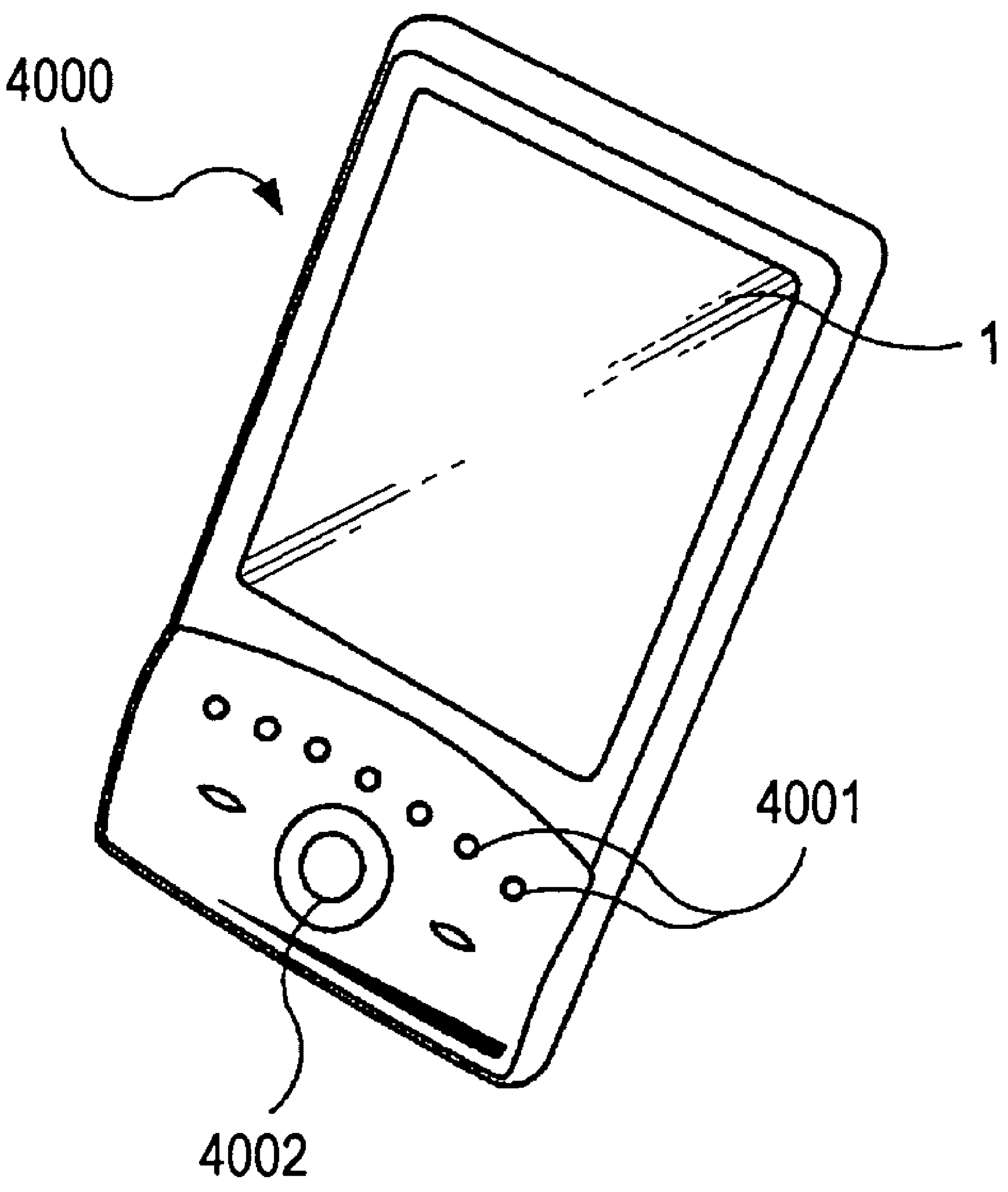
FIG. 10 is a view illustrating a personal digital assistant to which the electro-optical device is applied.

FIG. 10 illustrates the configuration of a personal digital assistant (PDA) to which the electro-optical device 1 is applied. The personal digital assistant 4000 includes a plurality of operation buttons 4001, a power switch 4002, and the electro-optical device 1 serving as a display unit. By operating the power switch 4002, various information items, such as an address list, a schedule note, or the like, are displayed on the electro-optical device 1.

Further, an electronic apparatus to which the electro-optical device 1 is applied includes a digital still camera, a liquid crystal television, a view finder type or monitor direct view type video tape recorder, a car navigation apparatus, a pager, an electronic diary, a desktop calculator, a word processor, a workstation, a video phone, a POS terminal, an apparatus having a touch panel, and the like, as well as those shown in FIGS. 8 to 10. Furthermore, the electro-optical device 1 can be applied to these various electronic apparatuses as a display unit. In addition, the electro-optical device 1 of the invention is not limited to a display unit of an electronic apparatus which directly displays images or characters, but may be applied as a light source of a printing apparatus which is used to indirectly form images or characters by irradiating light onto an object to be photosensitized.

What is claimed is:

1. A unit circuit, comprising:

a capacitive element having a first electrode, a second electrode, and a dielectric layer interposed between the first electrode and the second electrode; and a transistor having a gate electrode coupled to the first electrode, an electric potential of the first electrode being set to a first electrical potential by supplying a first operation signal to the second electrode, the supplying of the first operation signal to the second electrode being carried out after the first electrode is set to a first predetermined electric potential, and the supplying of the first operational signal to the second electrode being carried out during at least a part of a period in which the first electrode is electrically disconnected from the first predetermined electric potential, after a first step during which the electrical potential of the first electrode is set to the first electrical potential is completed, a second step during which the electrical potential of the first electrode is set to a second predetermined electric potential while a second operation signal is supplied to the second electrode being carried out, and the electrical potential of the first electrode being set to a second electrical potential by supplying a third operation signal to the second electrode after the first step is completed, the supplying of the third operation signal to the second electrode being carried out during at least a part of a period in which the first electrode is electrically disconnected from the second predetermined electric potential.

2. The unit circuit according to claim 1, a voltage level of the first predetermined electric potential being equal to a voltage level of the second predetermined electric potential.

3. The unit circuit according to claim 1, further comprising:

a first switching element that controls an electrical connection between the first electrode and at least one of the first predetermined electric potential and the second predetermined electrical potential; and a second switching element that is coupled to the second electrode.

4. The unit circuit according to claim 1, the first electric potential and the second electric potential having opposite polarities to each other when the first predetermined electric potential is used as a reference potential.

5. The unit circuit according to claim 1, the first electric potential being higher than the first predetermined electric potential, and the second electric potential being lower than the first predetermined electric potential.

6. The unit circuit according to claim 1, a signal level of the first operation signal being equal to a signal level of the second operation signal.

7. An electronic device comprising the unit circuit according to claim 1.

8. A method of controlling a unit circuit that includes a capacitive element having a first electrode, a second electrode, and a dielectric layer interposed between the first electrode and the second electrode, a transistor having a gate electrode coupled to the first electrode; a first switching element that controls an electrical connection between the first electrode and a predetermined electric potential; and a second switching element connected to the second electrode, the method comprising:

setting an electric potential of the first electrode to the predetermined electric potential by turning on the first switching element;

setting the electric potential of the first electrode to a first electric potential by supplying a first operation signal to the second electrode through the second switching element during at least part of a period in which the second transistor is in an ON-state, the supplying of the first operation signal to the second electrode being carried out during at least a part of a period in which the first electrode is electrically disconnected from the predetermined electric potential by turning off the first switching element;

turning on the first switching element after a period during which the electric potential of the first electrode is set to the first electric potential is completed, and supplying a second operation signal to the second electrode through the second switching element during at least part of a period in which the second transistor is in an ON-state, the supplying of the second operation signal to the second electrode being carried out during at least a part of a period in which the electrical potential of the first electrode is set to the predetermined potential; and setting the electric potential of the first electrode to a second electric potential by supplying a third operation signal to the second electrode through the second switching element during at least part of a period in which the second transistor is in an ON-state, and the supplying of the third operation signal to the second electrode being carried out during at least a part of a period in which the first electrode is electrically disconnected from the predetermined electric potential by turning off the first switching element, a polarity of a voltage level of the first electric potential being opposite to a polarity of a voltage level of the second electric potential when the predetermined electric potential is used as a reference potential.

9. An electronic device, comprising:

a plurality of first signal lines;

a plurality of second signal lines;

a plurality of power supply lines; and a plurality of unit circuits, each of the plurality of unit circuits including:

a capacitive element having a first electrode, a second electrode, and a dielectric layer interposed between the first and second electrodes;

a transistor having a gate electrode connected to the first electrode;

a first switching element that controls an electrical connection between the first electrode and one of the plurality of power supply lines; and a second switching element connected to the second electrode, an electric potential of the first electrode is set to a first electric potential by supplying a first operation signal to the second electrode through the second switching element during at least part of a period in which the second switching element is in an ON-state, the supplying of the first operation signal to the second electrode being carried out after the first electrode is electrically connected to one power line of the power supply lines by turning on the first switching element, and the supplying of the first operation signal to the second electrode being carried out during at least a part of a period in which the first electrode is electrically disconnected from the one power supply line, after a first step during which the electrical potential of the first electrode is set to the first electrical potential is completed, a second step during which the first electrode is electrically connected to the one power supply line by turning on the first switching element while a second operation signal is supplied to the second electrode through the second switching element during at least part of a period in which the second switching element is in an ON-state being carried out, and the electric potential of the first electrode is set to a second electric potential by supplying a third operation signal to the second electrode through the second switching element during at least part of a period in which the second switching element is in an ON-state, the supplying of the third operation signal to the second electrode being carried out after the second period is completed, and the supplying of the third operation signal to the second electrode being carried out during at least a part of a period in which the first electrode is electrically disconnected from the one power supply line by turning off the first switching element.

10. The electronic device according to claim 9, wherein the one power supply line is set to a predetermined potential, and the first and second electric potentials have opposite polarities to each other when the predetermined electric potential is used as a reference potential.

11. The electronic device according to claim 9, the plurality of first signal lines being a plurality of scanning lines, the plurality of second signal lines being a plurality of data lines, the plurality of scanning lines including a plurality of first control lines and a plurality of second control lines, the first switching element being controlled by a first control signal supplied through one first control signal line of the plurality of first control signal lines, and the second switching element being controlled by a second control signal supplied through one second control signal line of the plurality of second control signal lines.

12. The electronic device according to claim 11, further comprising:

a driven element;

a scanning line driving circuit that drives the plurality of scanning lines; and a data line driving circuit that drive the plurality of data line, during an initialization period, the scanning line driving circuit generates the first control signal and the second control signal so as to turn on the first switching element and the second switching element, respectively, and the data line driving circuit sets a potential of the second electrode to a reference potential, during an operation period subsequent to the initialization period, the scanning line driving circuit generates the first control signal and the second control signal so as to turn off the first switching element and turn on the second switching element and the data line driving circuit changes the potential of the second electrode to an operation potential for driving the driven element from the reference potential, and then the scanning line driving circuit generates the first control signal and the second control signal so as to turn off the first switching element and the second switching element, respectively, during a reset period subsequent to the operation period, the scanning line driving circuit generates the first control signal and the second control signal so as to turn on the first switching element and the second switching element, respectively, and the data line driving circuit sets the level of the data signal to the operation potential, and during a recovery period subsequent to the reset period, under a state in which the scanning line driving circuit generates the first control signal and the second control signal so as to turn off the first switching element and turn on the second switching element, respectively, the data line driving circuit sets the level of the data signal to the reference potential, and then the scanning line driving circuit generates the second control signal so as to turn off the second switching element.

13. The electronic device according to claim 12, the one power supply line being set to a predetermined potential, and the potential of the first electrode being set to the predetermined potential during the reset period.

14. The electronic device according to claim 12, the driven element being an electro-optical element.

15. The electronic device according to claim 9, the transistor being made of amorphous silicon.

16. The electronic device according to claim 9, that the electric potential of the first electrode is set to the second electric potential suppresses a shift of a threshold voltage level of the transistor.

17. The electronic device according to claim 9, a signal level of the first operation signal being equal to a signal level of the second operation signal.

18. The electronic device according to claim 9, the setting of the electric potential of the first electrode to the first electric potential by supplying the first operation signal to the second electrode and the setting of the electric potential of the first electrode to the second electric potential by supplying the third operation signal to the second electrode using a capacitance coupling of the capacitive element.

19. An electronic apparatus comprising the electronic device according to claim 9.

* * * * *